(12) United States Patent
Inoue et al.

(10) Patent No.: US 8,453,076 B2
(45) Date of Patent: May 28, 2013

(54) WAVEFRONT ENGINEERING OF MASK DATA FOR SEMICONDUCTOR DEVICE DESIGN

(75) Inventors: Tadanobu Inoue, Kanagawa-ken (JP); David O. Melville, Yorktown Heights, NY (US); Hidemasa Muta, Kanagawa (JP); Alan E. Rosenbluth, Yorktown Heights, NY (US); Kehan Tian, Hopewell Junction, NY (US); Masaharu Sakamoto, Kanagawa-ken (JP); Saeed Bagheri, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 185 days.

(21) Appl. No.: 12/725,287

(22) Filed: Mar. 16, 2010

(65) Prior Publication Data

US 2011/0231803 A1 Sep. 22, 2011

(51) Int. Cl.
*G06F 17/50* (2006.01)

(52) U.S. Cl.
USPC .......................................................... 716/53

(58) Field of Classification Search
USPC .......................................................... 716/53
See application file for complete search history.

(56) References Cited

U.S. PATENT DOCUMENTS

| | | | | |
|---|---|---|---|---|
| 7,805,700 B2 * | 9/2010 | Peng | ............................... | 716/51 |
| 7,954,071 B2 * | 5/2011 | Barnes et al. | ................... | 716/53 |
| 2006/0126046 A1 | 6/2006 | Hansen | | |
| 2007/0184357 A1 | 8/2007 | Abrams et al. | | |
| 2007/0184369 A1 | 8/2007 | Abrams et al. | | |
| 2008/0077907 A1 | 3/2008 | Kulkami | | |
| 2008/0282211 A1 | 11/2008 | Culp et al. | | |
| 2008/0301620 A1 * | 12/2008 | Ye et al. | ........................... | 716/19 |
| 2009/0037868 A1 | 2/2009 | Chabreck et al. | | |
| 2009/0180711 A1 | 7/2009 | Lavin et al. | | |
| 2009/0193387 A1 | 7/2009 | Mukherjee et al. | | |
| 2010/0281449 A1 | 11/2010 | RosenBluth et al. | | |

OTHER PUBLICATIONS

B. Lin et al., "Inverse lithography technology at chip scale," Proc. of SPIE, vol. 6154, year 2006.
International search report and written opinion in counterpart PCT patent application PCT/US 11/28720, dated May 20, 2011.
International Preliminary Examination Report in corresponding PCT patent application PCT/US2011/028720, dated Sep. 27, 2012.

* cited by examiner

*Primary Examiner* — Jack Chiang
*Assistant Examiner* — Brandon Bowers
(74) *Attorney, Agent, or Firm* — Vazken Alexanian

(57) ABSTRACT

Optical wave data for a semiconductor device design is divided into regions. First wavefront engineering is performed on the wave data of each region, accounting for just the wave data of each region and not accounting for the wave data of neighboring regions of each region. The optical wave data of each region is normalized based on results of the first wavefront engineering. Second wavefront engineering is performed on the wave data of each region, based at least on the wave data of each region as has been normalized. The second wavefront engineering takes into account the wave data of each region and a guard band around each region that includes the wave data of the neighboring regions of each region. The second wavefront engineering can be sequentially performed by organizing the regions into groups, and sequentially performing the second wavefront engineering on the regions of each group in parallel.

20 Claims, 6 Drawing Sheets

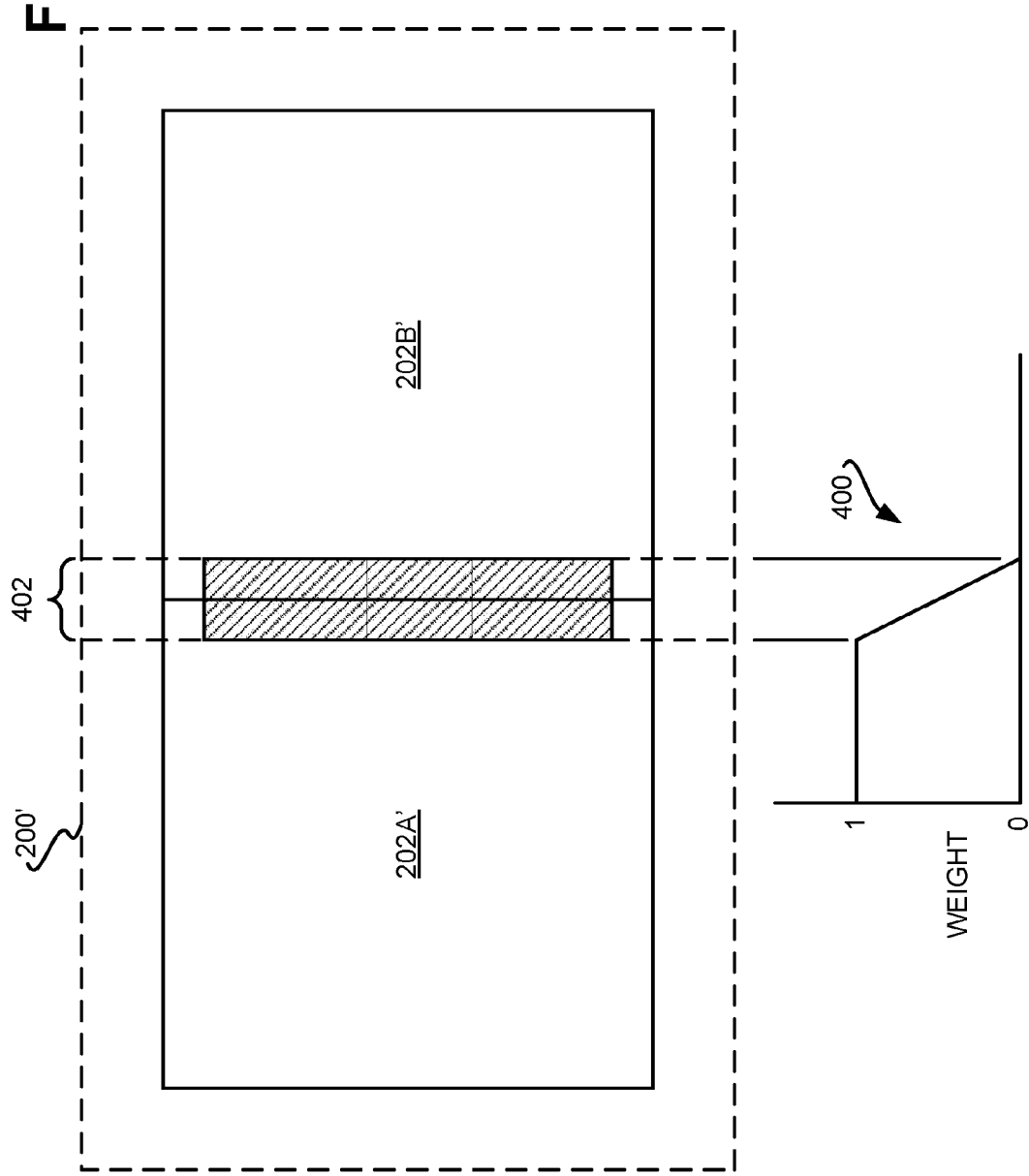

WAVEFRONT ENGINEERING OF MASK DATA FOR SEMICONDUCTOR DEVICE DESIGN

FIELD OF THE INVENTION

The present invention relates generally to a semiconductor device design that has mask data and that can be used to fabricate instances of the semiconductor device. The present invention relates more particularly to performing wavefront engineering on this mask data to optimize the mask data when utilized during device fabrication.

BACKGROUND OF THE INVENTION

One type of semiconductor device fabrication process is known as photolithography, or as just lithography. In photolithography, a material such as photoresist, which can also be referred to as just resist, is exposed to a light source through a photomask, which can also be referred to as just a mask. The material that is exposed to light is ultimately removed, such that the material that is not exposed to the light is not removed. Alternatively, the material that is not exposed to the light may be ultimately removed, such that the material that is exposed to the light is not removed.

To fabricate semiconductor devices having smaller and smaller features, the photomasks corresponding to the designs for such semiconductor devices may be modified so that photolithography is properly performed. One type of modification is known as optical proximity correction (OPC). OPC is a photolithography enhancement technique used to compensate for image errors due to diffraction or process effects. For instance, projected images may appear with irregularities such as line widths that are narrower or wider than designed, rounded corners instead of squared corners, and so on.

Conventional OPC corrects these errors by moving mask edges in a counter-biasing manner, until sufficient counter-bias is accumulated such that the image irregularities are determined to be approximately cancelled under some nominal set of imaging conditions. The mask may also be modified by adding extra polygons or other features in sparse areas of the pattern that is written on the photomask, so that each region of the mask contains patterns with similar spacings and densities. These extra features are referred to as assist features, and tend to reduce the variability in printed features as process conditions fluctuate. The conventional adjustment of polygon edges and insertion of assist features are both referred to herein as conventional OPC.

Another type of modification is source mask optimization (SMO), which simultaneously optimizes both the light source and the photomask shape. SMO is more complicated than simply adding assist features to photomask designs or moving edges within the photomask as is achieved in conventional OPC. In OPC, photomask designs are modified in accordance with a feedback counter-biasing method, or according to rules for assist feature deployment. By comparison, in SMO, more complex modifications are made to photomask designs in order to optimize the mask patterns, and simultaneously to optimize the light source pattern that illuminates the mask. In one particular SMO approach, an optimal set of light source and optical mask pattern are determined which define preferred illumination and imaging waves within a lithographic exposure process by using optimization techniques. At this point, optical mask pattern is ideally represented in frequency domain or continuous values. Wavefront engineering is then used to determine a set of actual manufacturable mask patterns that can produce the optimal imaging waves when the mask patterns are illuminated by the optimal illumination beams.

As such, wavefront engineering refers to the generation of manufacturable mask shapes that, when illuminated from some point in an exposure source, produce a specified optical wave within the light beam that is collected by a lithographic exposure tool. The waves can be specified on any plane or surface since it is known how to propagate waves from one surface to another. Two natural choices are to specify the waves in the pupil of the projection lens of the exposure tool (the waves being, for example, diffraction order amplitudes), or as field amplitudes at points on the exit face of the mask containing the mask shapes. In the latter case, the waves may be understood as a map of the transmission of an equivalent continuous mask, which may be in pixel values.

SUMMARY OF THE INVENTION

A method of an embodiment of the invention includes a processor of a computing device dividing optical wave data into regions. After dividing the optical wave data into the regions, the processor performs first wavefront engineering on the optical wave data of each region, taking into account just the optical wave data of each region and not taking into account the optical wave data of a plurality of neighboring regions of each region. After performing the first wavefront engineering on the optical wave data of each region, the processor normalizes the optical wave data of each region, based on results of the first wavefront engineering. After normalizing the optical wave data of each region, the processor performs second wavefront engineering on the optical wave data of each region, based at least on the optical wave data of each region as has been normalized. The second wavefront engineering takes into account the optical wave data of each region and a guard band around each region that includes the optical wave data of the neighboring regions of each region.

In one embodiment, the method includes receiving the optical wave data. The optical wave data may be generated in accordance with one or more mask design processes. The first wavefront engineering and the second wavefront engineering are performed independently of and without regard to the types of these mask design processes. For example, the optical wave data may be generated by performing optical proximity correction (OPC), and by transforming the results of the OPC into the optical wave data (such as by Fourier transformation), independently on each region and in parallel. It is noted that in this and other examples, the regions into which the optical wave data is divided correspond to the regions in accordance on which the mask design processes have been performed independently and in parallel. As a second example, the optical wave data may be generated by performing source mask optimization (SMO) independently on each region and in parallel.

As a third example, the regions may include first regions and second regions. The optical wave data may be generated for the first regions in accordance with a first mask design process performed independently on each first region and in parallel. By comparison, the optical wave data may be generated for the second regions in accordance with a second mask design process (different than the first mask design processes) performed independently on each second region and in parallel. For instance, the first mask design process may be OPC, whereas the second mask design process may be SMO, where OPC may be performed on regions having relatively sparse concentrations of semiconductor devices, and SMO may be performed on regions having relatively dense concentrations of such devices.

A computer-readable medium of an embodiment of the invention has a computer program stored thereon. Execution of the computer program by a processor of a computing device causes a method to be performed. The method divides optical wave data for a semiconductor device design into regions. After dividing the optical wave data into the regions, the method performs first wavefront engineering on the optical wave data of each region, taking into account just the optical wave data of each region and not taking into account the optical wave data of a plurality of neighboring regions of each region. After performing the first wavefront engineering on the optical wave data of each region, the method normalizes the optical wave data of each region, based on results of the first wavefront engineering. After normalizing the optical wave data of each region, the method performs second wavefront engineering on the optical wave data of each region, based at least on the optical wave data of each region as has been normalized. The second wavefront engineering takes into account the optical wave data of each region and a guard band around each region that includes the optical wave data of the neighboring regions of each region.

A semiconductor device of an embodiment of the invention is fabricated by using a mask. The mask generated by performing a method. The method includes a processor of a computing device dividing optical wave data into regions. After dividing the optical wave data into the regions, the processor performs first wavefront engineering on the optical wave data of each region, taking into account just the optical wave data of each region and not taking into account the optical wave data of a plurality of neighboring regions of each region. After performing the first wavefront engineering on the optical wave data of each region, the processor normalizes the optical wave data of each region, based on results of the first wavefront engineering. After normalizing the optical wave data of each region, the processor performs second wavefront engineering on the optical wave data of each region, based at least on the optical wave data of each region as has been normalized. The second wavefront engineering takes into account the optical wave data of each region and a guard band around each region that includes the optical wave data of the neighboring regions of each region.

BRIEF DESCRIPTION OF THE DRAWINGS

FIGS. 2, 3, 4A and 4B are diagrams depicting representative performance of various parts of the method of FIG. 1, according to differing embodiments of the present invention.

DETAILED DESCRIPTION OF THE DRAWINGS

Figure 1:
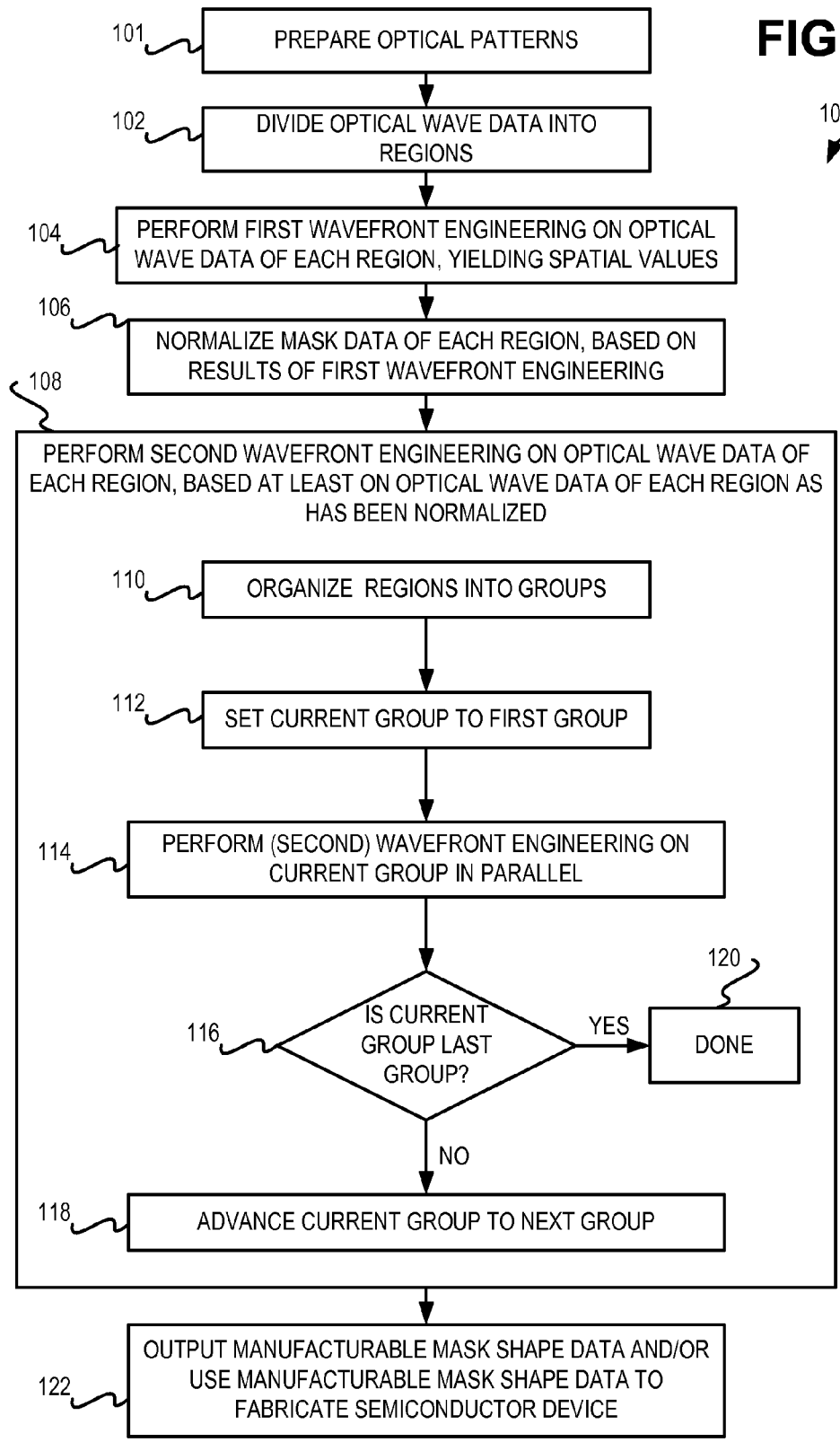
FIG. 1 is a flowchart of a method, according to an embodiment of the present invention.

As noted in the background section, wavefront engineering can be performed on optimized waves for lithographic imaging, so that subsequent photolithography employing the mask patterns produced by wavefront engineering can properly lithographically print the desired features on, for example, a semiconductor wafer containing semiconductor devices in the process of being fabricated. To speed up the performance of wavefront engineering, one prior art approach divides optimized wave data into a number of work units, and performs wavefront engineering on each work unit, independently, and often in parallel. That is, each work unit has wavefront engineering independently performed thereon, concurrently if not simultaneously with every other work unit having wavefront engineering performed thereon. Even when the independent work units are processed serially, the total processing time will typically be reduced if the processing operation contains unfavorable nonlinearities whose impact is reduced when the work is divided into separate parts.

A problem with this approach occurs at the boundaries between work units. Once wavefront engineering has been performed on each work unit, the work units have to be "stitched" back together to realize the photomask in question. Because wavefront engineering is performed on each work unit independently, however, there can be inconsistencies and incompatibilities at the boundaries of the work units at which the work units are stitched together.

To minimize these inconsistencies and incompatibilities, the prior art approach considers a "guard band" around a given work unit when performing wavefront engineering on the given work unit. The guard band takes into account a portion of the optical wave data within each work unit that is an immediate neighbor of the given work unit. However, this workaround does not completely eliminate the inconsistencies and incompatibilities at the boundaries of the work units.

This is because the guard band takes into account a portion of the original optical wave data within each work unit that is an immediate neighbor of the given work unit. That is, the guard band cannot take into a portion of the actual mask shape data after wavefront engineering within each neighboring work. This is because the optical wave data of each work unit is wavefront engineered independently, and often in parallel (i.e., concurrently) with the optical wave data of every other work unit. Wavefront engineering of each work unit just has access to the original optical wave data of each work unit.

Similar incompatibilities arise in other approaches for designing lithographic masks of large area that are processed using overlapping work units, such as large masks whose features are processed with optical proximity correction (OPC), or with assist feature layout. In general, incompatibilities can arise in the mask patterns of neighboring mask areas that are processed as separate work units.

Embodiments of the present invention overcome these problems. In particular, two types of wavefront engineering are performed on the optical wave data. The optical wave data is divided into regions. First wavefront engineering is performed on the optical wave data of each region, on which basis the optical wave data of each region can be normalized. This first wavefront engineering may be considered coarse wavefront engineering, because it takes into account just the optical wave data of each region, and does not take into account the optical wave data of any neighboring region.

Once the mask data of each region has been normalized, second wavefront engineering is performed on the mask data of each region, based at least on the mask data of each region as has been normalized based on the first wavefront engineering. This second wavefront engineering may be considered fine wavefront engineering, because it takes into account the mask data of each region, as well as a guard band around each region that includes the mask data of the neighboring regions.

The second wavefront engineering effectively stitches the regions back together to form a photomask that can be used in photolithography.

In one embodiment, the second wavefront engineering is performed by organizing the regions into groups. Each region is assigned to only one group. The guard band around a given region of a given group does not overlap any other region of the given group and does not overlap the guard band around any other region of the given group. As such, second wavefront engineering can be sequentially performed on the regions of each group in parallel.

For example, second wavefront engineering can be performed in parallel first on the regions of one group, and then be performed in parallel on the regions of another group, and so on, until the regions of all the groups have had second wavefront engineering performed thereon. In these ways, wavefront engineering can be performed such that the inconsistencies and incompatibilities at the boundaries of the regions are at least substantially eliminated. Furthermore, parallel processing is still performed during the second wavefront engineering—with regards to the regions of the groups on a group-by-group basis—so that performance is not overly degraded.

Wavefront engineering can thus be considered as an element of source mask optimization (SMO), and as such the extended set of optical waves that is divided into separate work units for optionally parallel wavefront engineering processing may be generated using SMO steps. However, an extended set of optical waves can also be generated by taking the Fourier transform of a preliminary set of mask patterns, where preliminary here means that the patterns have yet to be fully designed. The Fourier transform provides amplitudes that diffract outward from the mask containing the mask patterns. Any mask design method might optionally be used to design the preliminary mask patterns, such as SMO, OPC, or assist feature generation.

Optical waves of neighboring work units can then be stitched by simple averaging of the wave amplitudes, providing the diffracted amplitudes of the entire set of preliminary mask patterns. This averaging can be weighted, for example, with ramped weights, so that on the particular side of an overlapped guard band that is closest to the center of a corresponding one of two overlapped work units, the weighting of the closer unit's waves can be made stronger. By comparison, on the opposite side of the overlapped guard band, the weighting of the other work unit's patterns can be strengthened, with the weights being ramped, such as linearly across the intermediate region between these two sides. In this respect, such optical waves are different from the preliminary mask patterns themselves, in that the latter are typically shapes which represent openings in a film, and are therefore typically binary in character. When incompatible binary shapes overlap in the guard bands of adjacent work units, the prior art is generally unable to determine a shape which represents an optimal stitching compromise between the incompatible shapes, since these binary shapes may have very different incompatible topologies.

Therefore, in mask design processes that do not involve SMO, such as OPC or assist feature generation, it is possible to form preliminary mask designs by applying an OPC or assist generation process independently to the preliminary mask patterns in separate overlapped work areas, and then to stitch these designs together by first Fourier transforming the processed preliminary designs to obtain sets of optical waves. Thereafter, the optical waves are stitched together by, for example, ramped weighted averaging. Stitched wavefront engineering is then employed to produce a stitched set of OPC'ed or assisted mask patterns that are free of stitch incompatibilities.

Such steps can also be applied in cases where the mask design has tentatively been completed, but where a certain number of problem areas are subsequently identified in which further improvement is desired. Each problem area can be handled as a separate work unit, with this work unit then being corrected or improved via, for example, SMO, or an intensive OPC method such as process-window OPC, or with a revised set of assist features, and then the work area and an overlapping guard band can be converted to optical waves by Fourier transform. These waves are then stitched together, by, for example, ramped weighted averaging. Stitched wavefront engineering is then employed to produce mask patterns in the corrected region that are compatible with the surrounding region. In these ways, therefore, the problems associated with the prior art are avoided.

FIG. 1 shows a method 100, according to an embodiment of the invention. The method 100 can be implemented as a computer program stored on a computer-readable data storage medium. The computer-readable data storage medium may be a volatile computer-readable medium, such as dynamic random access memory, a non-volatile computer-readable medium, such as a hard disk drive or flash memory, and/or another type of computer-readable medium. A processor of a computing device, such as a computer, executes the computer program to result in performance of the method 100. As such, a processor of a computing device can be considered as performing each part of the method 100.

An optical pattern is prepared as the input data for wavefront engineering (101). The optical pattern can be prepared by taking the Fourier transform of the target design on a wafer, or the Fourier transform of an OPC'ed mask design, or the output from source mask optimization (SMO). These optical domain values, which are collectively referred to in general as optical wave data, are typically frequency domain values, and can be continuous. The optical pattern represents an ideal mask shape and ideal wavefront engineering. By comparison, for instance, spatial domain values can represent actual mask shape and can only be a binary value where, for instance, a bi-tone mask is employed. For example, in the case of a chrome on glass mask, the transmission value of mask is either zero or one. There cannot be intermediate values, which are by comparison permitted in optical patterns.

The optical wave data received in part 101 thus may be prepared in accordance with nearly any type of mask design process, such as OPC or SMO. For example, in OPC-type processes, OPC is typically not considered as generating optical wave data. By comparison, part 101 of the method 100 advantageously—and contrary to this prior art assumption—nevertheless treats the output of OPC as optical wave data. As such, the method 100 as a whole, and thus embodiments of the invention, provide for a way to stitch very general kinds of design processes together, even if the design processes themselves do not presume that such stitching together is possible. This will become more evidence as the method 100 is described in detail herein.

Figure 2:
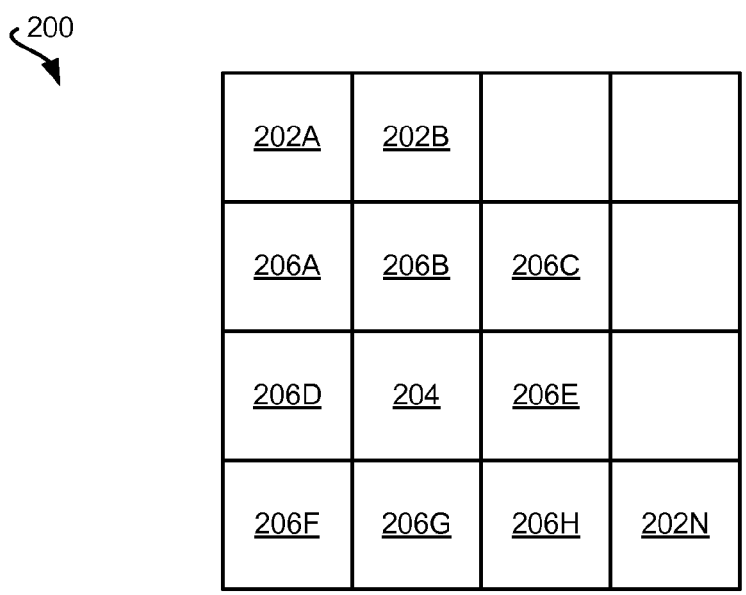

The optical pattern is divided into regions (102). Each region into which each optical pattern has been divided thus includes an optical pattern in an optical domain. FIG. 2 shows representative performance of part 102 of the method 100, according to an embodiment of the invention. The mask data 200 is divided into regions 202A, 202B, . . . , 202N, collectively referred to as the regions 202. The mask data 200 is more generally referred to as optical wave data. In the example of FIG. 2, the regions 202 are rectangular regions that are organized into a grid having a number of rows and a number of columns. Just four rows and four columns are depicted in FIG. 2 for illustrative convenience. In actuality, however, there will usually be a large number of rows and a large number of columns, such as hundreds of rows and hundreds of columns, if not more.

In FIG. 2, one particular region 204 of the regions 202 is exemplarily called out. The region 204 is called out to show how each region 202 has a number of neighboring regions. The region 204 specifically has eight neighboring regions 206A, 206B, 206C, 206D, 206E, 206F, 206G, and 206H, collectively referred to as the neighboring regions 206. The neighboring regions 206 include regions 206B, 206D, 206E, and 206G that each share a side with the region 204. The neighboring regions 206 also include regions 206A, 206C, 206F, and 206H that each share a corner with the region 204.

Referring back to FIG. 1, after the mask data (i.e., the optical wave data) has been divided into regions, what is referred to as first wavefront engineering is performed on the mask data (i.e., the optical wave data) of each region (104). The first wavefront engineering may be performed on the mask data (i.e., the optical wave data) of each region in parallel in one embodiment. That is, this wavefront engineering may be performed on the mask data (i.e., the optical wave data) of a given region in parallel with the performance of this wavefront engineering on the mask data (i.e., the optical wave data) of every other region. The first wavefront engineering of a given region takes into account the mask data of just the given region, and does not take into account the mask data (i.e., the optical wave data) of any other region, such as the neighboring regions of the given region. In this respect, the first wavefront engineering is considered a coarse wavefront engineering, because it does not take into account the neighboring regions of a given region when performing wavefront engineering on the given region.

The first wavefront engineering converts the optical values of the mask data (i.e., the optical wave data) in the optical domain to a spatial domain. As such, the original optical pattern values (i.e., the optical values), are converted to spatial values, where the spatial values represent the actual mask shape.

Figure 3:
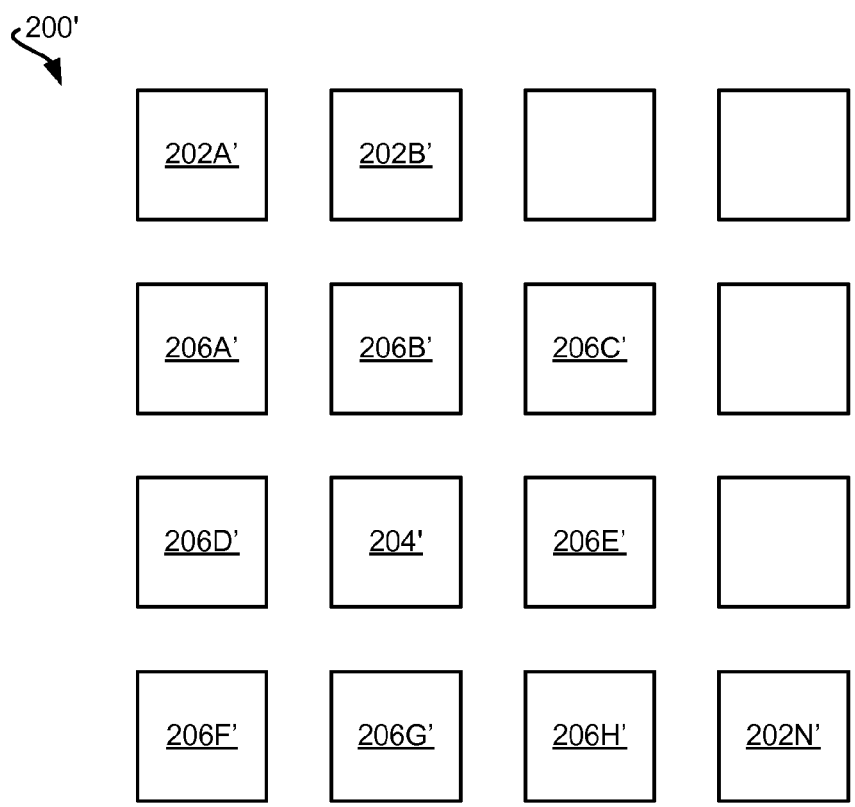

FIG. 3 shows representative performance of part 104 of the method 100, according to an embodiment of the invention. The mask data 200 of FIG. 2 is denoted as the mask data 200' in FIG. 3, to represent that the optical values have been converted to spatial values in accordance with the first wavefront engineering. As such, the regions 202 of FIG. 2 have corresponding regions 202' in FIG. 3. As noted above, the mask data 200 is more generally referred to as optical wave data. Whereas the regions 202 in FIG. 2 represent regions of optical values, the regions 202' in FIG. 3 represent regions of spatial values into which the optical values have been converted.

The regions 202' are depicted in FIG. 3 in an exploded fashion, such that they do not touch one another, to underscore the fact that each region 202 is converted to a corresponding region 202' by taking into account just the mask data (i.e., the optical wave data) of the region 202, and not by taking into account the mask data (i.e., the optical wave data) of any other region 202. For example, the region 204' represents the spatial values into which the optical values of the corresponding region 204 of FIG. 2 have been converted. In this conversion, none of the optical values of the neighboring regions 206 of FIG. 2, and none of the spatial values of the neighboring regions 206' in FIG. 3, are taken into account.

Referring back to FIG. 1, after the first wavefront engineering has been performed, the mask data (i.e., the optical wave data) of each region is normalized based on the results of the first wavefront engineering (106). That is, the optical values of each region are normalized based on the spatial values of all the regions resulting from the first wavefront engineering. Such normalization ensures that every region has the same brightness, or intensity level. This is performed because ultimately when the photomask is used during photolithography, the entire photomask is exposed to a light source. That is, all the regions of the photomask are exposed to the light source at the same time.

The normalization of part 106 can be referred to as dose matching. Dose matching ensures that the optical values of the mask data (i.e., the optical wave data) in each region are based on exposure to the same "dose" of light that will be employed during photolithography. In one embodiment, normalization is performed based on the results of the first wavefront engineering as follows.

First, there are optical values, such as the average values of diffraction-order values of divided optical patterns in each region. These values may be represented as doInitA, doInitB, doInitC, . . . , doInitN. The first wavefront engineering results in frequency domain values being obtained by taking the average values of the Fourier transform value of each wavefront engineered mask shape. These values may be represented as doWeA, doWeB, doWeC, . . . , doWeN. Conversion efficiencies for each region can then be determined by dividing the former values by the latter values, or (doInitA/doWeA), (doInitB/doWeB), (doInitC/doWeC), . . . , (doInitN/doWeN). The minimum conversion efficiency is selected for the normalization, and which may be represented as K. Each initial optical value (i.e., doInitA, doInitB, and so on), is multiplied by K to obtain normalized optical values for each region.

Figure 4A:
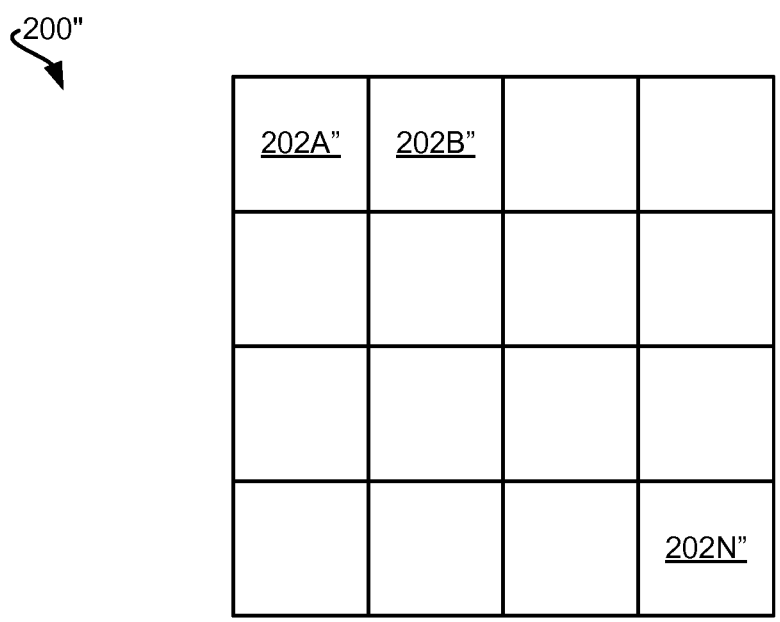

FIG. 4A shows representative performance of part 106 of the method 100, according to an embodiment of the invention. The mask data 200 of FIG. 2 is denoted as the mask data 200" in FIG. 4A, to represent that the optical values have been normalized (based on the spatial values resulting from the first wavefront engineering). As such, the regions 202 of FIG. 2 have corresponding regions 202A", 202B", . . . 202"N, collectively referred to as the regions 202", in FIG. 4A. As noted above, the mask data 200 may be more generally referred to as optical wave data. Whereas the regions 202 in FIG. 2 represent regions of un-normalized optical values, the regions 202" in FIG. 4A represent regions of normalized optical values.

The regions 202" are not depicted in FIG. 4A in an exploded fashion. This is because the optical values are normalized by using the spatial values of all the regions 202' of FIG. 3. That is, as noted above, the spatial values of all the regions 202' are analyzed to ultimately locate a minimum conversion efficiency value. On the basis of this minimum conversion efficiency value, the optical values of the regions 202 of FIG. 2 are normalized to result in the normalized optical values of the regions 202" of FIG. 4A. Therefore, in this way, it can be said that the spatial values of all the regions 202' of FIG. 3 are used to generate the normalized optical values of the regions 202".

FIG. 4B shows how the spatial domain values can be reverted back to optical domain values, according to a specific embodiment of the invention. In particular, the mask data 200' in FIG. 4B represents the spatial values to which the optical values have been converted in accordance with the first wavefront engineering. The two regions 202A' and 202B' are particularly called out in FIG. 4B. The weight function 404 indicates, for the region 202A', the extent to which the region 202A' is used when converting back the spatial values of the region 202A' to optical values, as opposed to the extent to which the region 202B' is used. The weight function 404 also indicates, for the region 202B', the extent to which the region 202A' is used when converting back the spatial values of the region 202B' to optical values, as opposed to the extent to which the region 202A' is used. The weight function 404 is depicted as being a linear ramp, but in other embodiments, can be another type of weight function.

To the left of the area 402, none of the region 202B' is used when converting the spatial values of the region 202A' back to optical values (or, stated another way, just the region 202A' is considered). However, in the area 402, the portion of the region 202A' that is used for this conversion decreases from left to right (linearly in the specific wave function 404 of FIG. 4B), such that the portion of the region 202B' that is used increases. Likewise, to the right of the area 402, none of the region 202A' is used when converting the spatial values of the region 202B' back to optical values (or, stated another way, just the region 202B' is considered). However, in the area 402, the portion of the region 202A' that is used for this conversion increases from right to left (linearly in the specific wave function 404 of FIG. 4B), such that the portion of the region 202B' that is used decreases.

Referring back to FIG. 1, after the mask data (i.e., the optical wave data) of each region has been normalized, second wavefront engineering is performed on the mask data (i.e., the optical wave data) of each region (108). Unlike the first wavefront engineering of part 104, the second wavefront engineering of a given region in part 108 takes into account the mask data (i.e., the optical wave data) of the given region, as well as the mask data (i.e., the optical wave data) of the neighboring regions of the given region. In this respect, the second wavefront engineering is considered a fine wavefront engineering, which is finer than the first wavefront engineering in granularity, because it does take into account the neighboring regions of a given region when performing wavefront engineering on the given region.

The second wavefront engineering also converts the optical values of the mask data in the optical domain to a spatial domain. In differing embodiments, the optical values of the mask data that are converted to the spatial domain can be one or more of the following. First, the optical values may be the normalized optical values resulting from the normalization of part 106. Second, the optical values may be, where a given region has already been converted into spatial values by performing the second wavefront engineering, and where the given region is needed for converting another region into spatial values, the spatial values of the given region as converted back into normalized optical values. In either case, then, the optical values that are converted to spatial values via the second wavefront engineering are ultimately the normalized optical values.

Furthermore, the manner by which the optical values of the mask data (i.e., the optical wave data) are converted to spatial values in a spatial domain can be that as is achieved conventionally. Because the second wavefront engineering of a given region takes into account the neighboring regions of the given region, inconsistencies and incompatibilities at the boundaries of these regions are eliminated, which is discussed in more detail later in the detailed description. In addition, it is said that the second wavefront engineering effectively stitches the regions together, due to the fact that the second wavefront engineering of a given region takes into account the neighboring regions of the given region.

In one embodiment, the wavefront engineering—such as the second wavefront engineering—is performed as described in the patent application entitled "Method for forming arbitrary lithographic wavefronts using standard mask technology," filed on Apr. 29, 2009, and assigned U.S. application Ser. No. 12/431,865. In this approach, a linear programming problem is solved to obtain optimized spatial data. In the linear programming problem, maximizing brightness or minimizing mask error enhance factor (MEEF) can be considered the objective, under various constraints regarding target optical values and manufacturability.

Figure 5:
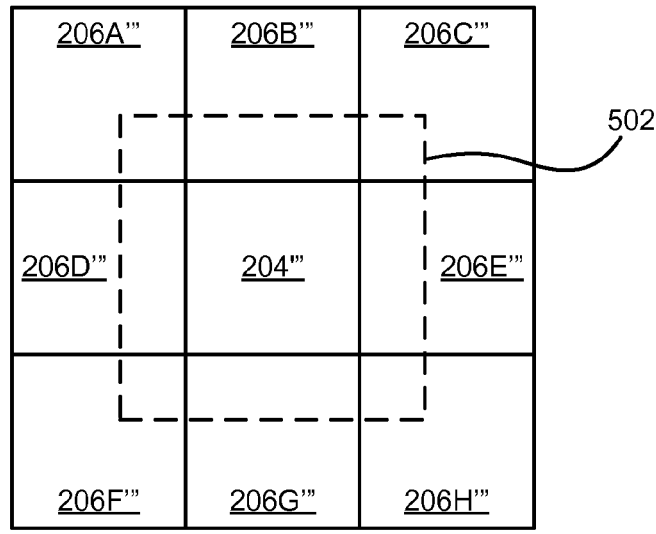
FIG. 5 is a diagram depicting how the second wavefront engineering of FIG. 1 is performed in relation to a representative region, according to an embodiment of the present invention.

FIG. 5 illustratively depicts the representative performance of part 108 of the method 100 in relation to a single representative region, according to an embodiment of the invention. The representative region 204" of normalized optical values is particularly depicted, as well as its neighboring regions. The regions 206A''', 206B''', 206C''', and 206D''' are denoted by triple primes, because these regions have already been subjected to the second wavefront engineering, and thus encompass spatial values. By comparison, the regions 206E'', 206F'', 206G'', and 206H'' are denoted by double primes, because these regions have not yet been subjected to the second wavefront engineering, and thus encompass normalized optical values. The focus of FIG. 5 is the conversion of the region 204" into the region 204'''—that is, from a region of normalized optical values to a region of spatial optical values, pursuant to the second wavefront engineering.

A guard band 502 is depicted in FIG. 5. The guard band 502 depicts the extent to which each of the regions 206A''', 206B''', 206C''', 206D''', 206E'', 206F'', 206G'', and 206H'' is taken into account when performing the second wavefront engineering on the region 204" to generate the region 204'''. That is, a portion of each of the neighboring regions of the region 204" is taken into account when performing the second wavefront region to generate the region 204'''.

Generating the region 204''' from the region 204" and its neighboring region is based on the normalized optical values of these regions. However, the regions 206A'–, 206B''', 206C''', and 206D''' encompass spatial values, and not optical values. Therefore, the spatial values of the regions 206A''', 206B''', 206C''', and 206D''' are temporarily converted back into normalized optical values for the generation of the region 204'''. By comparison, the regions 206E'', 206F'', 206G'', and 206H'' already still encompass normalized optical values, and do not have to be converted for the second wavefront engineering to be performed on the region 204" to generate the region 204'''.

As noted above, the second wavefront engineering of embodiments of the invention eliminates inconsistencies and incompatiblities at the boundaries of regions, whereas the prior art can at best minimize, but not completely eliminate, such inconsistencies and incompatibilities. The prior art cannot completely eliminate them, because of the nature of the parallel execution of the wavefront engineering that is performed, on a per-region basis. That is, by performing wavefront engineering on all the regions in parallel, such that the wavefront engineering is performed on one region concurrently and/or simultaneously with the wavefront engineering being performed on each other region, dependencies at the boundaries of the regions cannot be accommodated within the prior art. As such, inconsistencies and incompatibilities at the boundaries may be able to be minimized by employing guard bands in the prior art, but cannot be completely eliminated.

By comparison, in one embodiment of the invention, a hybrid sequential-parallel approach is employed to completely eliminate such inconsistencies and incompatibilities at the boundaries of regions. In particular, the regions are suitably organized into groups, where each region is assigned to only one group. This organization is such that the guard band around a given region of a given group does not overlap any other region of the given group, and does not overlap the guard band around any other region of the given group.

The regions within each group can be subjected to the second wavefront engineering in parallel, such that each region within a given group is subjected to the second wavefront engineering concurrently and/or simultaneously with every other region in the same group being subjected to the second wavefront engineering. However, the groups themselves are processed sequentially. For instance, first all the regions of a first group are processed (i.e., by being subjected to the second wavefront engineering in parallel), after which all the regions of a second group are processed, and so on. This approach sequentially employs parallelism, because just the regions of a given group are subjected to the second wavefront engineering in parallel at any given time. Different groups of regions are processed sequentially. This approach is now described in detail.

Figure 6:
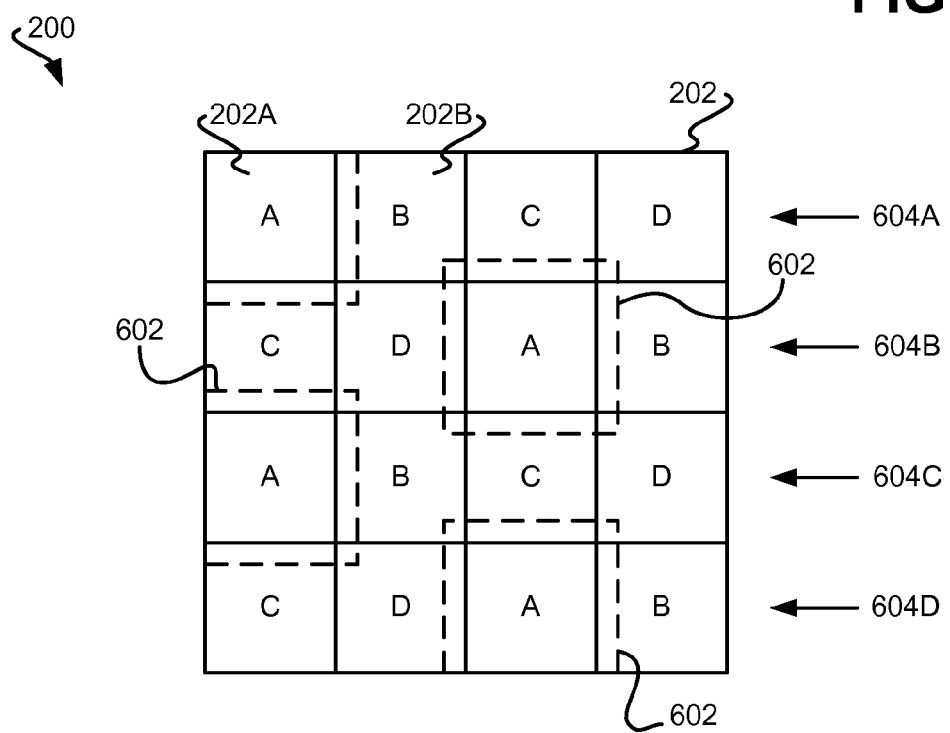
FIG. 6 is a diagram depicting how the second wavefront engineering of FIG. 1 is performed on group of regions-by-group of regions basis, according to an embodiment of the present invention.

Referring back to FIG. 1, then, in one embodiment, part 108 is performed by first organizing the regions into groups (110), as noted above. FIG. 6 shows how the regions 202 of the mask data 200 of FIG. 2 can be divided into four different groups, according to an embodiment of the invention. In the middle of each region 202 in FIG. 6 is a letter, either A, B, C, or D. The letters A, B, C, and D correspond to the four groups A, B, C, and D into which the regions 202 have been divided, where the letter inside a particular region 202 denotes the group to which that region 202 belongs. As noted above, the mask data 200 may more generally be considered optical wave data.

The regions 202 are organized into these four groups A, B, C, and D as follows. The regions 202 of odd-numbered rows of the grid, such as the first and the third rows 604A and 604C, are sequentially and repeatedly assigned to the groups A, B, C, and D starting with the group A. By comparison, the regions 202 of the even-numbered rows, such as the second and the fourth rows 604B and 604D, are sequentially and repeatedly assigned to the groups A, B, C, and D starting with the group C.

This organization of the regions 202 into the four groups A, B, C, and D ensures that the guard band around a given region does not overlap any other region in the same group, and does not overlap the guard band of any other region in the same group. For example, in FIG. 6, the guard bands around the regions 202 belonging to group A are indicated by dotted lines 602. The guard band around each such region 202 belonging to group A does not overlap any other region in the same group A, and does not overlap the guard band of any other region in group A.

Therefore, the regions 202 within the group A can be subjected to the second wavefront engineering in parallel, with a complete elimination of inconsistencies and incompatibilities at the boundaries, because the guard band of each region 202 within the group A does not overlap any other region 202 within the group A. This is in contradistinction to the prior art, where subjecting regions to wavefront engineering in parallel results in regions being processed that have guard bands that overlap other regions being processed.

For example, in relation to FIG. 6, the region 202A may be processed in parallel to the region 202B in the prior art. However, the guard band of the region 202A overlaps the region 202B, and vice-versa. This means that race conditions can occur when these two regions 202A and 202B are being processed at the same time, such that the inconsistencies and incompatibilities at the boundary between the regions 202A and 202B may at best be minimized, but cannot be eliminated as in embodiments of the present invention.

Referring back to FIG. 1, then, a current group is set to the first group of the groups into which the regions have been organized (112). The second wavefront engineering is performed on all the regions of the current group in parallel (114). Thereafter, if the current group is not the last group (116), then the current group is advanced to the next group (118), and the method 100 is repeated at part 114 for the new current group. Once all the groups of regions have undergone second wavefront engineering, such that the current group is the last group (116), part 108 is finished (120).

Referring again to FIG. 6, then, first the regions 202 within group A are subjected to second wavefront engineering in parallel. When this is done, then the regions 202 within group B are subjected to second wavefront engineering in parallel. When this is done, the regions 202 within group C are subjected to second wavefront engineering in parallel. When this is done, the regions 202 within group D are subjected to second wavefront engineering in parallel. It is thus said that wavefront engineering of a region of a given group is performed in parallel with the other regions of this given group, but the region of a given group is performed in series (i.e., sequentially) in relation to regions of other groups.

Referring back to FIG. 1 one final time, once second wavefront engineering has been performed, the resulting manufacturable mask shape data may be output or used to fabricate instances of a semiconductor device (122), the latter as is conventional. The result of the second wavefront engineering is actual mask shape data that includes spatial values in which inconsistencies and incompatibilities among the boundaries of the regions are eliminated. This mask data represents a mask that can be output, such as by being displayed on a display device to a user, communicated over a network, printed using a printing device, stored on a storage device and so on. Ultimately, the mask that this mask data represents is employed in photolithography to fabricate instances of the semiconductor device having a design to which the mask corresponds.

The method 100 thus provides a way to stitch very general kinds of mask design processes together, where most mask design processes are carried out in independent work units for the sake of efficiency. In all prior art except for SMO, the mask design processes are never considered as yielding optical wave data, which by comparison the method 100 presumes is the starting point. Furthermore, even SMO does not stitch optical wave data as in the method 100, nor the subsequent stitching of the wavefront engineering itself. The optical waves resulting from the wavefront engineering in the method 100 can be obtained by performing Fourier transforms on the mask patterns of independently designed work units (i.e., regions), for example. In general, the method 100 is thus applicable to all types of mask design processes, such as SMO, OPC, and so on. The crux of the method 100 is that the optical wave data can be independently generated for the regions that have been described, and then stitched together in accordance with the method 100.

Figure 7A:
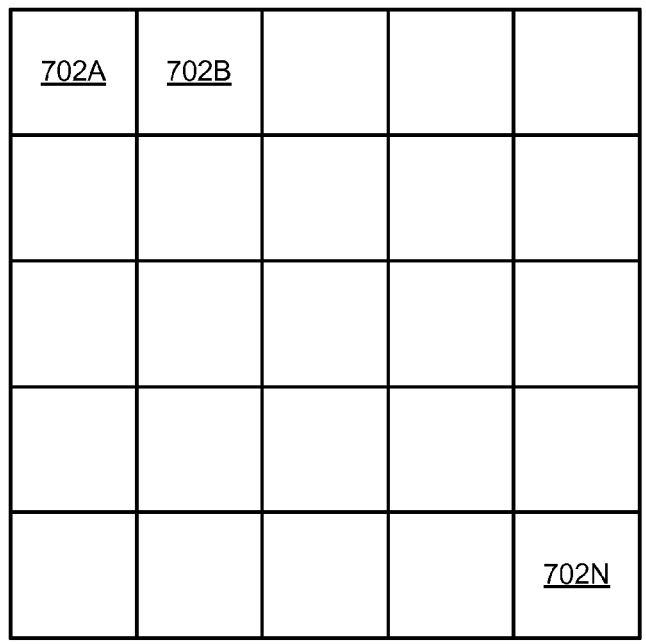
FIGS. 7A and 7B are diagrams depicting different types of photomasks in relation to which the method of FIG. 1 can be performed, according to different embodiments of the present invention.
Figure 7B:
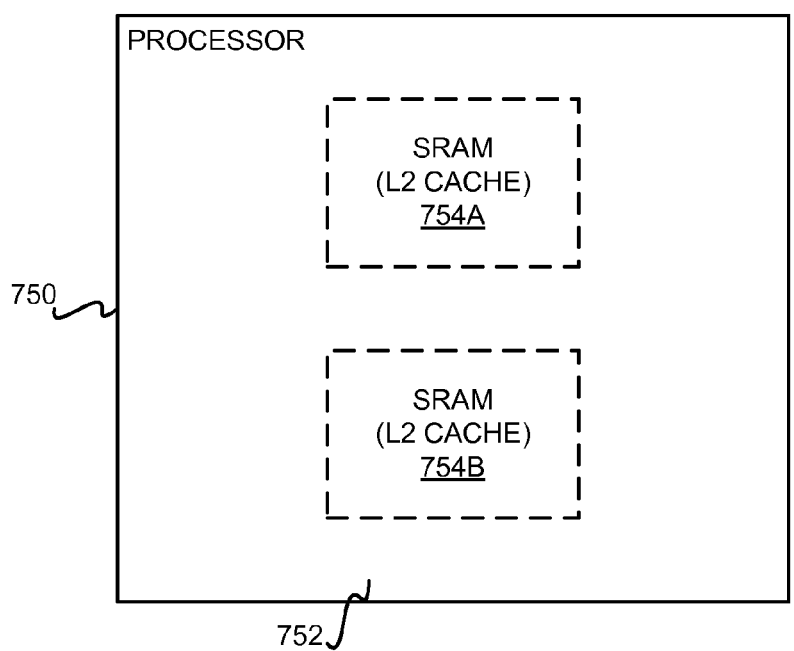

To underscore this advantage of the method 100, FIGS. 7A and 7B show two different types of photomasks in relation to which the method 100 can be performed, according to different embodiments of the invention. In FIG. 7A, the photomask 700, or mask data, is divided into regions 702A, 702B, . . . , 702N, collectively referred to as the regions 702. OPC can be independently performed on each region 702, and then Fourier transformed to result in the optical wave data upon which the method 100 is operative. Alternatively, SMO can be independently performed on each region 702 to result in the optical wave data upon which the method 100 is operative.

That is, so long as the resulting of the mask design process—such as OPC or SMO—results in optical wave data, it does not matter what type of mask design process is employed for the method 100 to be operative. The method 100 is thus a generalized approach that can stitch together the results of such a mask design process that is applied to each region 702 independently of every other region 702. Parallelism can be advantageously employed to generate the optical wave data on a region 702-by-region 702 basis, and then the method 100 used to stitch together the optical wave data of the different regions 702.

Furthermore, different mask design processes can be employed in different regions. For instance, in FIG. 7B, a photomask 750, or mask data, is for a processor, such as a central processing unit (CPU). The photomask 750 has a primary area 752, and two secondary areas 754A and 754B, which are collectively referred to as the secondary areas 754. The primary area 752 has a relatively sparse concentration of semiconductor devices, whereas the secondary areas 754 have a relatively dense concentration of semiconductor devices. In the example of FIG. 7B, the secondary areas 754 may correspond to static random access memory (SRAM), such as the level-two (L2) caches of the processor of FIG. 7B.

The primary area 752 can be divided into first regions, and the secondary areas 754 can be divided into second regions, which is not depicted in FIG. 7B. Traditional OPC can be performed in parallel on the first regions, and the results Fourier transformed to yield optical wave data, whereas SMO can be performed in parallel on the second regions to result in optical wave data. The optical wave data of all the first and the second regions are then stitched together by performing the method 100.

As such, FIG. 7B shows that different mask design processes can be employed in different regions as needed, and such heterogeneously yielded optical wave data still be stitched together in accordance with the method 100. This is advantageous, as different portions of the photomask 750 may benefit from different types of mask design processes. Sparse concentrations of semiconductor devices, such as in the area 752, may be able to have OPC performed on them, which is typically performed more quickly than SMO is. By comparison, just dense concentrations of semiconductor devices, such as in the areas 754, may have SMO performed on them, which is typically performed more slowly than OPC is.

In other words, because the method 100 has to receive as input optical wave data that has been generated independently on a region-by-region basis, it does not matter to the ultimate performance of the method 100 what mask design process was used to generate the optical wave data of a given region. As FIG. 7B demonstrates, OPC (and subsequently Fourier transforming) can be used to generate the optical wave data of some regions, and SMO used to generate the optical wave data of other regions. The method 100 is independent of the mask design processes that are used to generate the optical wave data of the given regions, which means that different mask design processes can be used to generate the optical wave data of different regions.

It is noted that in FIGS. 7A and 7B, the regions on which one or more mask design processes, such as OPC and/or SMO, are performed independently and in parallel to yield the optical wave data can be the regions into which the mask data as a whole is divided in part 102 of the method 100. Stated another way, the division of the mask data into regions in part 102 can be achieved by simply using the same regions on which the mask design processes were performed to yield the optical wave data. Thus, in such an embodiment, the division of the mask data into regions in part 102 is not a new division, but rather is the same division that was performed prior to performing the mask design processes on such regions, independently and in parallel.

In conclusion, it is noted that, although specific embodiments have been illustrated and described herein, it will be appreciated by those of ordinary skill in the art that any arrangement that is calculated to achieve the same purpose may be substituted for the specific embodiments shown. Other applications and uses of embodiments of the invention, besides those described herein, are amenable to at least some embodiments. This application is intended to cover any adaptations or variations of the present invention. Therefore, it is manifestly intended that this invention be limited only by the claims and equivalents thereof.

We claim:

1. A method comprising:
    dividing optical wave data for a semiconductor device design, by a processor of a computing device, into a plurality of regions;
    after dividing the optical wave data into the regions, performing first wavefront engineering on the optical wave data of each region, by the processor, taking into account just the optical wave data of each region and not taking into account the optical wave data of a plurality of neighboring regions of each region;
    after performing the first wavefront engineering on the optical wave data of each region, normalizing the optical wave data of each region, by the processor, based on results of the first wavefront engineering; and,
    after normalizing the optical wave data of each region, performing second wavefront engineering on the optical wave data of each region, by the processor, based at least on the optical wave data of each region as has been normalized, taking into account the optical wave data of each region and a guard band around each region that includes the optical wave data of the neighboring regions of each region.

2. The method of claim 1, further comprising receiving the optical wave data, wherein the optical wave data is generated in accordance with one or more mask design processes, such that the first wavefront engineering and the second wavefront engineering are performed independently of and without regard to one or more types of the one or more mask design processes,
    wherein the regions into which the optical wave data is divided correspond to the regions in accordance on which the mask design processes have been performed independently and in parallel.

3. The method of claim 1, further comprising receiving the optical wave data, wherein the optical wave data is generated by performing optical proximity correction (OPC) and by transforming results of the OPC into the optical wave data, independently on each region and in parallel.

4. The method of claim 1, further comprising receiving the optical wave data, wherein the optical wave data is generated by performing source mask optimization independently on each region and in parallel.

5. The method of claim 1, further comprising receiving the optical wave data, wherein the regions comprise first regions for which the optical wave data has been generated in accordance with a first mask design process performed independently on each first region and in parallel, and second regions for which the optical wave data has been generated in accordance with a second mask design process performed independently on each first region and in parallel.

6. The method of claim 5, wherein the first mask design process is optical proximity correction and the second mask design process is source mask optimization.

7. The method of claim 1, further comprising outputting results of the second wavefront engineering.

8. The method of claim 1, further comprising using results of the second wavefront engineering to fabricate semiconductor device instances of the semiconductor device design.

9. The method of claim 1, wherein dividing the optical wave data into the regions comprises dividing the optical wave data into a plurality of rectangular regions organized in a grid having rows and columns.

10. The method of claim 9, wherein performing the second wavefront engineering comprises:
organizing the regions into four groups, where the regions of odd-numbered rows of the grid are sequentially and repeatedly assigned to the groups starting with a first group, and where the regions of even-numbered rows of the grid are sequentially and repeatedly assigned to the groups starting with a third group;
performing the second wavefront engineering on the regions of the first group in a parallel manner;
after the second wavefront engineering has been performed on the regions of the first group, performing the second wavefront engineering on the regions of a second group in the parallel manner;
after the second wavefront engineering has been performed on the regions of the second group, performing the second wavefront engineering on the regions of the third group in the parallel manner; and,
after the second wavefront engineering has been performed on the regions of the third group, performing the second wavefront engineering on the regions of a fourth group in the parallel manner.

11. The method of claim 1, wherein performing the first wavefront engineering on the optical wave data of each region is performed in a naïve parallel manner for each region, taking into account just the optical wave data of each region and not taking into account the optical wave data of the neighboring regions.

12. The method of claim 1, wherein performing the first wavefront engineering on the optical wave data of each region comprises generating spatial domain values of each region from optical domain values of each region originally present within the optical wave data.

13. The method of claim 12, wherein normalizing the optical wave data of each region, based on the results of the first wavefront engineering, comprises normalizing the optical domain values of each region within the optical wave data based on the spatial domain values that have been generated.

14. The method of claim 13, wherein performing the second wavefront engineering on the optical wave data of each region comprises generating spatial domain values of each region from one or more of:
normalized optical domain values of each region resulting from normalizing the optical wave data of each region;
normalized optical domain values of each region converted back from the spatial domain values of each region that have already been generated by the second wavefront engineering.

15. The method of claim 1, wherein performing the second wavefront engineering comprises:
organizing the regions into a plurality of groups, including a first group and a last group, such that each region is assigned to only one of the groups, and such that the guard band around a given region of a given group does not overlap any other region of the given group and does not overlap the guard band around any other region of the given group; and,
sequentially performing the second wavefront engineering on the regions of each group in a parallel manner, such that the second wavefront engineering is first performed on the regions of the first group in the parallel manner, and such that the second wavefront engineering is performed last on the regions of the last group in the parallel manner.

16. The method of claim 1, wherein performing the second wavefront engineering results in the optical wave data of the regions being effectively stitched together.

17. The method of claim 1, wherein performing the second wavefront engineering comprises solving a linear programming problem.

18. The method of claim 1, wherein the second wavefront engineering is finer in granularity than the first wavefront engineering.

19. A computer-readable storage device having a computer program stored thereon that when executed by a processor of a computing device causes a method to be performed, the method comprising:
dividing optical wave data for a semiconductor device design into a plurality of regions;
after dividing the optical wave data into the regions, performing first wavefront engineering on the optical wave data of each region, taking into account just the optical wave data of each region and not taking into account the optical wave data of a plurality of neighboring regions of each region;
after performing the first wavefront engineering on the optical wave data of each region, normalizing the optical wave data of each region, based on results of the first wavefront engineering; and,
after normalizing the optical wave data of each region, performing second wavefront engineering on the optical wave data of each region, based at least on the optical wave data of each region as has been normalized, taking into account the optical wave data of each region and a guard band around each region that includes the optical wave data of the neighboring regions of each region.

20. The method of claim 1, wherein the regions on which the second wavefront engineering is performed are identical to the regions on which the first wavefront engineering is performed,
and wherein the regions on which the second wavefront engineering is performed are the regions into which the optical wave data has been divided prior to both the first wavefront engineering and the second wavefront engineering being performed.

* * * * *